United States Patent
Yiu et al.

(10) Patent No.: US 9,088,206 B2
(45) Date of Patent: Jul. 21, 2015

(54) POWER MODULE AND THE METHOD OF PACKAGING THE SAME

(76) Inventors: Ho-Yin Yiu, KLN (HK); Chien-Hung Liu, New Taipei (TW); Wei-Chung Yang, Pingzhen (TW); Bai-Yao Lou, Hsinchu (TW)

( * ) Notice: Subject to any disclaimer, the term of this patent is extended or adjusted under 35 U.S.C. 154(b) by 457 days.

(21) Appl. No.: 13/359,466

(22) Filed: Jan. 26, 2012

(65) Prior Publication Data
US 2012/0194148 A1  Aug. 2, 2012

Related U.S. Application Data

(60) Provisional application No. 61/437,495, filed on Jan. 28, 2011.

(51) Int. Cl.
| | |
|---|---|
| H01L 29/06 | (2006.01) |
| H01L 27/06 | (2006.01) |
| H04B 1/02 | (2006.01) |
| H02M 3/155 | (2006.01) |
| H02M 3/00 | (2006.01) |
| H01F 17/00 | (2006.01) |
| H01L 23/64 | (2006.01) |
| H01L 25/16 | (2006.01) |
| H01L 23/00 | (2006.01) |
| H01L 25/07 | (2006.01) |

(52) U.S. Cl.
CPC ............ *H02M 3/155* (2013.01); *H01F 17/0006* (2013.01); *H01L 23/645* (2013.01); *H01L 25/165* (2013.01); *H02M 3/00* (2013.01); *H01F 2017/0046* (2013.01); *H01F 2017/0073* (2013.01); *H01F 2017/0086* (2013.01); *H01L 24/16* (2013.01); *H01L 25/072* (2013.01); *H01L 2224/16225* (2013.01); *H01L 2924/13091* (2013.01); *H01L 2924/16195* (2013.01); *H01L 2924/19105* (2013.01)

(58) Field of Classification Search
USPC .......... 257/337, 368, 379, 506, 531, E27.011, 257/E27.014, E27.114, E29.02, E29.325, 257/E21.22; 438/106, 381, 425
See application file for complete search history.

(56) References Cited

U.S. PATENT DOCUMENTS

| | | | |
|---|---|---|---|
| 2004/0198253 A1* | 10/2004 | Kondo et al. | 455/91 |
| 2010/0140714 A1 | 6/2010 | Ren et al. | |
| 2012/0038023 A1* | 2/2012 | Ren et al. | 257/506 |
| 2012/0319200 A1* | 12/2012 | Arnborg | 257/337 |

FOREIGN PATENT DOCUMENTS

CN  101283449  10/2008

* cited by examiner

*Primary Examiner* — Dao H Nguyen
(74) *Attorney, Agent, or Firm* — Liu & Liu

(57) ABSTRACT

A power module includes a substrate; a conductive path layer formed on the substrate with a specific pattern as an inductor; a connection layer being formed on the substrate and electrically connected to a first terminal of the inductor; and a first transistor, electrically mounted on the substrate through the connection layer.

20 Claims, 8 Drawing Sheets

US 9,088,206 B2

POWER MODULE AND THE METHOD OF PACKAGING THE SAME

CROSS-REFERENCE TO RELATED APPLICATIONS

This application claims the benefit of U.S. Provisional Application No. 61/437,495, filed on Jan. 28, 2011, the contents of which are incorporated herein by reference.

BACKGROUND OF THE INVENTION

1. Field of the Invention

The invention relates to a power module, and in particular, relates to a method of packaging the power module.

2. Description of the Related Art

Power converters have been widely utilized in commercialized power management category. For example, DC/DC conversion, or providing constant current flow. FIG. 1A shows a diagram of a traditional power converter 100. The power converter 100 comprises a pulse width modulating controller (PWM controller), NMOSFETs Q1 and Q2, an inductor L1, and a capacitor C1. The PWM controller controls ON/OFF state of the NMOSFETs Q1 and Q2 by providing a first control signal Hdry to a gate of the NMOSFET Q1 and providing a second control signal Ldry to a gate of the NMOSFET Q2, wherein the first control signal Hdry is a periodical signal, and the second control signal Ldry is complemetary to the first control signal Hdrv. When the first control signal Hdry is HIGH and the second control signal Ldry is LOW, the NMOSFET Q1 is ON and the NMOSFET Q2 is OFF, and the inductor L1 and the capacitor C1 are charged through the NMOSFET Q1 by an input voltage VDD. When the first control signal Hdry is LOW and the second control signal Ldry is HIGH, the NMOSFET Q1 is OFF and the NMOSFET Q2 is ON, and the inductor L1 and the capacitor C1 are discharged through the NMOSFET Q2 toward a reference voltage level GND, The power converter 100 thus provides a constant voltage output Vload to a load Rload.

With advancement of VLSI fabrication technology, cost, footprint and design flexibility of power modules have become crucial. Modulized packaging of power modules have gained a significant advantage over traditional packaging. For example, as shown in FIG. 1B, a power converter 200 integrates a PWM controller, and NMOSFETs Q1 and Q2 into a multi-chip module (MCM) 20. FIG. 1C shows another power converter 300, which integrates NMOSFETs Q1 and Q2 into an independent package structure 30. However, the power modules mentioned above are inconvenient when being incorporated with different PWM controllers and still have room for improvement.

BRIEF SUMMARY OF THE INVENTION

Some exemplary embodiments of the invention show a power module, which comprises a substrate; a inductor formed on the substrate, wherein the inductor comprises a conductive path layer with a particular pattern; a connection layer formed on the substrate, wherein the connection layer is electrically connected to a first terminal of the inductor; and a first transistor, electrically coupled on the substrate through the connection layer.

Other exemplary embodiments of the invention show a method of packaging a power module, which comprises providing a substrate; forming a connection layer and a conductive path layer on the first side of the substrate, wherein the conductive path layer comprises a particular pattern to work as an inductor, and the connection layer is electrically connected to a first terminal of the conductive path layer; and mounting at least one transistor electrically through the conductive path layer on the substrate.

BRIEF DESCRIPTION OF THE DRAWINGS

The invention can be more fully understood by reading the subsequent detailed description and examples with references made to the accompanying drawings, wherein:

FIG. 3A-8A are top views showing the process steps of fabricating a power module 40.

FIG. 3B-8B are cross sectional views showing the process steps of fabricating a power module 40.

DETAILED DESCRIPTION OF THE INVENTION

Figure 1A:
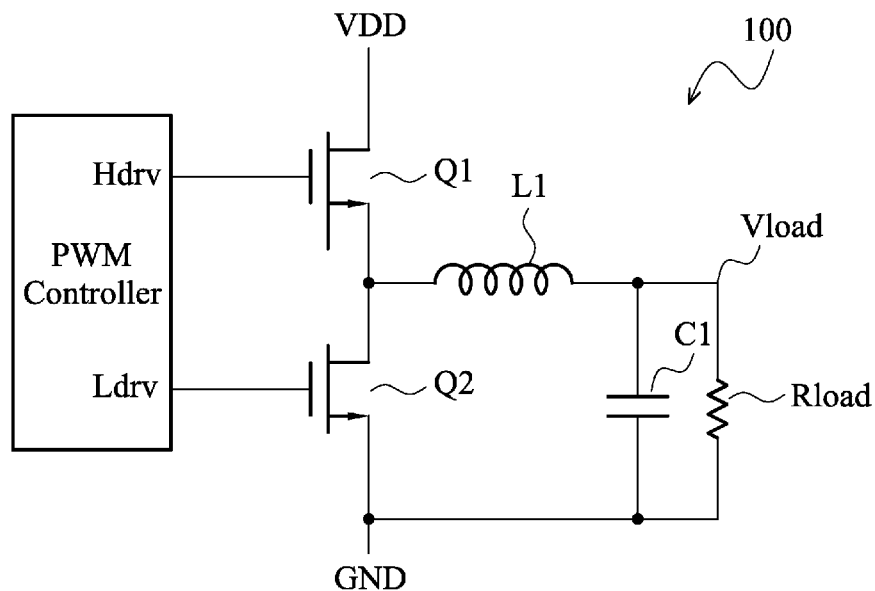
FIG. 1A is a circuit diagram of a traditional power converter 100.
Figure 1B:
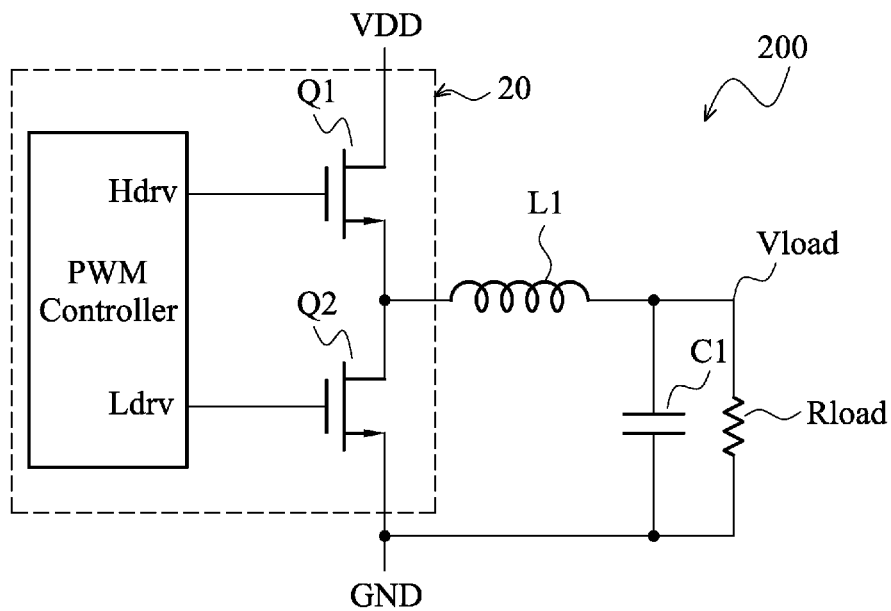
FIG. 1B is a circuit diagram of a power module 20 and corresponding power converter 200.
Figure 1C:
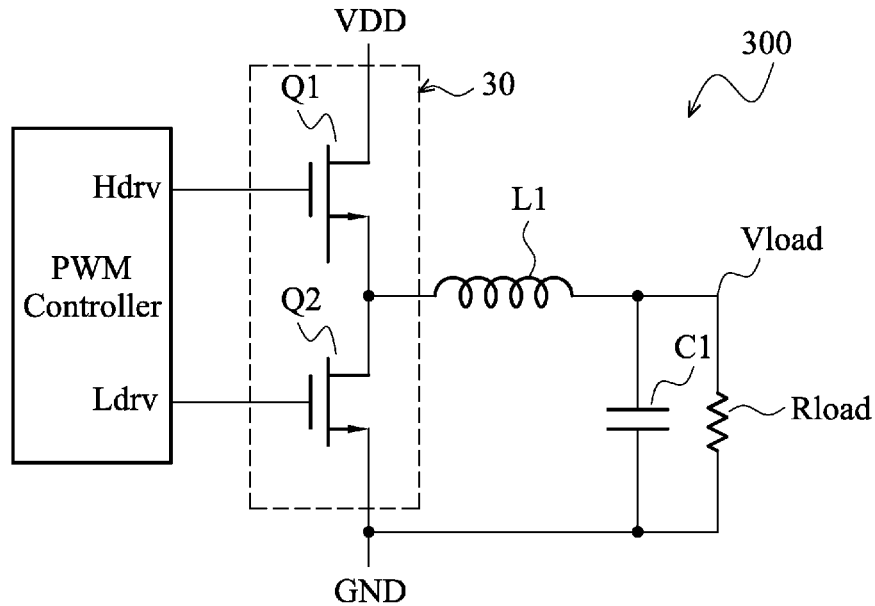
FIG. 1C is a circuit diagram of a power module 30 and corresponding power converter 300.
Figure 2:
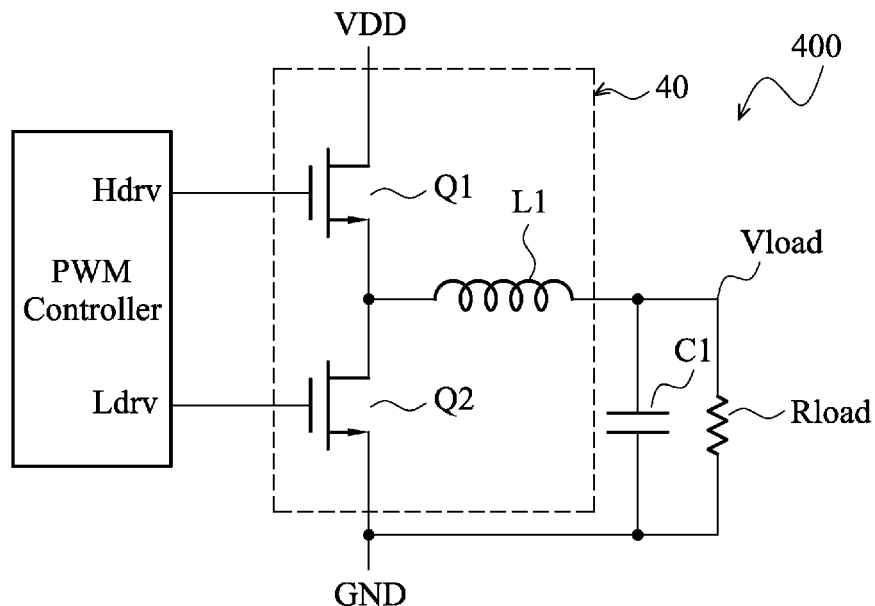
FIG. 2 is a circuit diagram of a power module 40 and corresponding power converter 400.

FIG. 2 shows a circuit diagram of power module 40 according to an embodiment of the invention and a corresponding power converter 400 using the power module 40. The power converter 400 comprises a power module 40, which integrates a first transistor Q1, a second transistor Q2, and an inductor L1 into a package; a PWM controller controlling ON/OFF states of the first transistor Q1 and the second transistor Q2 by sending a first control signal Hdry and a second control signal Ldry to gates of the transistors Q1 and Q2, respectively; and a capacitor C1.

When the first control signal Hdry switches the first transistor to ON, the second control signal Ldry switches the first transistor to OFF. Thus, the inductor L1 and the capacitor C1 are charged via the first transistor Q1 by an input voltage VDD. When the first control signal Hdry switches the first transistor to OFF, the second control signal Ldry switches the first transistor to ON. Thus, the inductor L1 and the capacitor C1 then discharge via the first transistor Q1 to a reference voltage level GND. Therefore the power converter 400 provides a constant output voltage Vload to a load Rload.

According to some embodiments of the invention, the second transistor Q2 in the power module 40 can be replaced by a switch device or a diode (not shown). The power module 40 described above is a buck converter, however it is not intended to limit the scope of the invention. The power module in the invention can be any power module comprising an inductor and at least a transistor, such as a boost converter, a buck-boost converter, a cuk converter or a single-ended primary industry converter (SEPIC), etc.

The following is an embodiment of packaging a power module 40 of the invention. It is for exemplary purposes and is not intended to limit the scope of the invention. Those skilled in the art can make any modification or substitution to carry out the same result and/or achieve the same advantages of the embodiments introduced herein using the examples, applications and principles disclosed in the invention.

FIG. 3A to 8A show the top views of the power module 40 during fabrication steps in an embodiment of the invention. FIG. 3B to 8B show the cross sectional views of the power module 40 during fabrication steps corresponding to FIG. 3A to 8A. Some of the exemplary drawings above are adjusted or modified for easy understanding. Moreover, parts and/or devices not shown in the figures are well-known by those who skilled in the art.

Figure 3A:
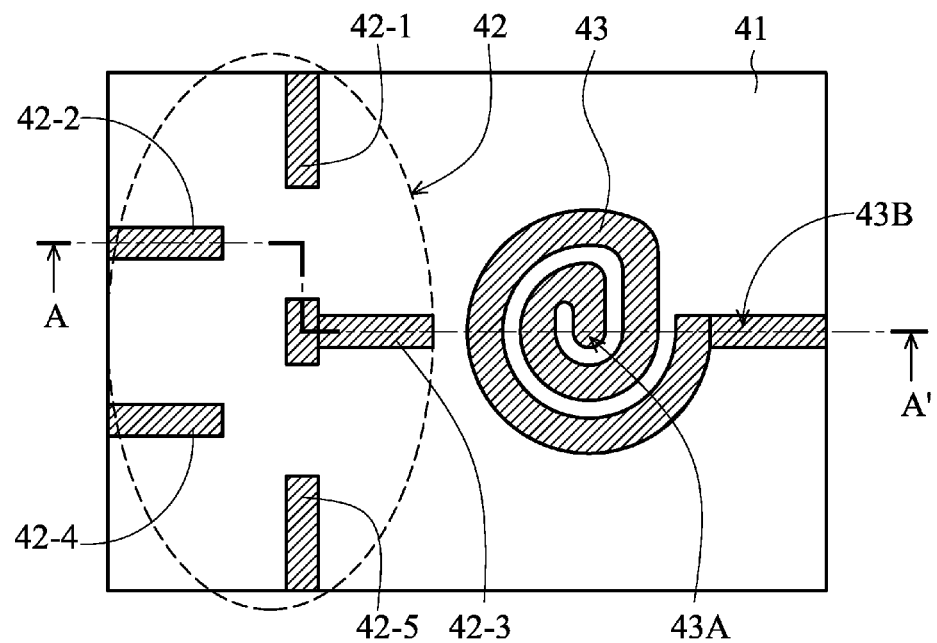
Figure 3B:
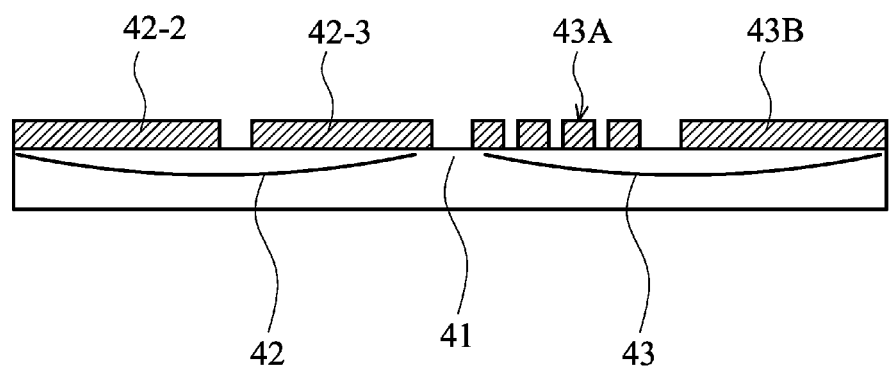

Refer to FIGS. 3A and 3B, wherein FIG. 3B is the corresponding cross-sectional view of FIG. 3A. Firstly, a substrate 41 is provided. Only a portion of the substrate 41 is shown in FIGS. 3A and 3B. In an embodiment, multiple following procedures can be performed simultaneously on the substrate 41 to form a plurality of power modules 40. In an embodiment, the material of the substrate 41 is glass. However, the material of the substrate 41 can also be other insulators such as quartz or plastic.

After, form a conductor layer on the substrate 41 and define a pattern on it using lithography. An etching process is performed on the conductive layer to further form a patterned first connection layer 42 and a conductive path layer 43. The first connection layer 42 provides connections between external circuits and devices within the power module 40. The first connection layer 42 comprises first to fifth portions, 42-1 to 42-5. For easy understanding, reference numerals of the first connection layer 42 will not be shown in later drawings. The conductive path layer 43 shown in FIG. 3A has a particular shape, for example, it can be a rectangular, polygonal, or circular spiral shape. The conductive path layer 43 can also be a transmission line shape or a meander shape. The conductive path layer 43 works to form an inductor L1 and comprises a first terminal 43A and a second terminal 43B. The materials of the first connection layer 42 and the conductive path layer 43 can be metals such as Al and Cu, conductive ceramics, conductive macromolecular materials, or combinations thereof. The first connection layer 42 and the conductive path layer 43 can be formed of the same material or different materials. The first connection layer 42 and the conductive path layer 43 can be formed on the substrate 41 simultaneously or sequentially.

Inductors usually occupy a significant amount of footprint in traditional power converter. However with the advancement of VLSI fabrication technology, transistors with faster switching rates are available, therefore inductors with smaller footprints and lower inductance can be incorporated to form a compact power module 400. In a preferred embodiment, the inductance of the inductor L1 is about 30 nH. However, the actual inductance value and size of the inductor depends on the switching speed of corresponding transistors.

Figure 4A:
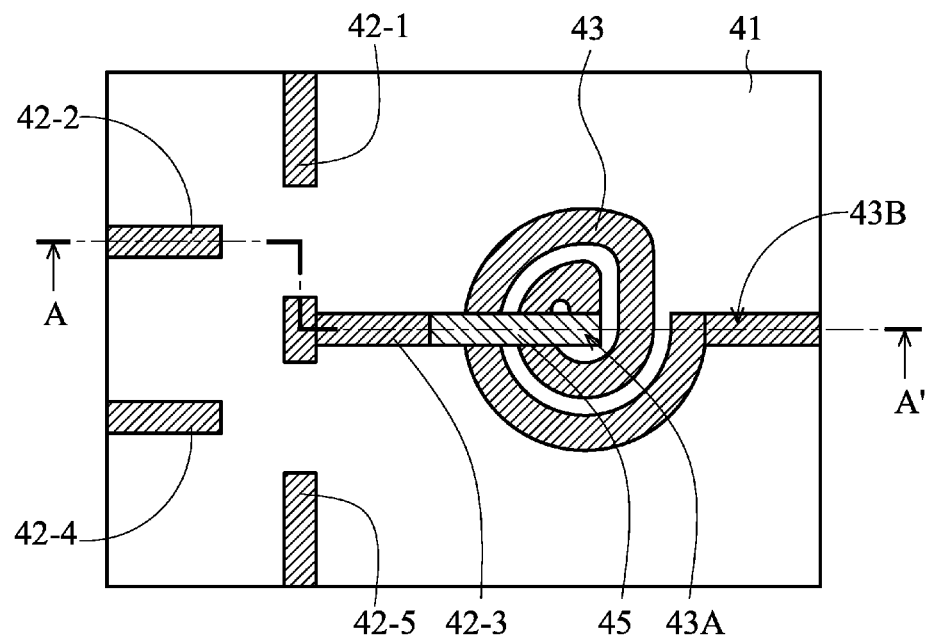
Figure 4B:
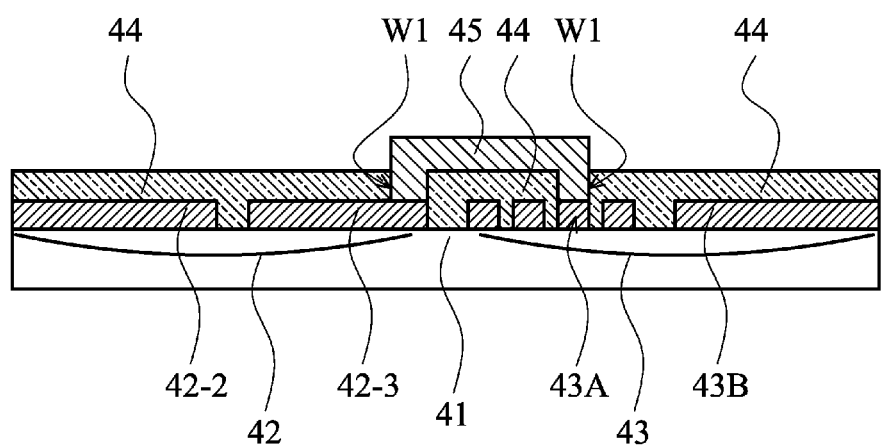

Refer to FIGS. 4A and 4B, wherein FIG. 4B is the side view along a cross section AA' of FIG. 4A. A protection layer on the first connection layer 42 and the conductive path layer 43 is formed, and a lithography process is performed to define a pattern, and a patterned first protection layer 44 is formed (shown in FIG. 4B). The first protection layer 44 has a plurality of windows W1, exposing the third portion 42-3 of the first connection layer 42, and the first portion 43A of the conductive path layer 43. Materials of the first protection layer 44 can be solder mask, Benzocyclobutene (BCB), Polyimide, or combinations thereof. After, a metal layer is formed, and a pattern is defined using a lithography process. Then an etching step is performed to form a second connection layer 45. The second connection layer 45 is electrically connected to the third portion 42-3 of the first connection layer 42 and the first portion 43A of the conductive path layer 43 via the windows W1.

Figure 5A:
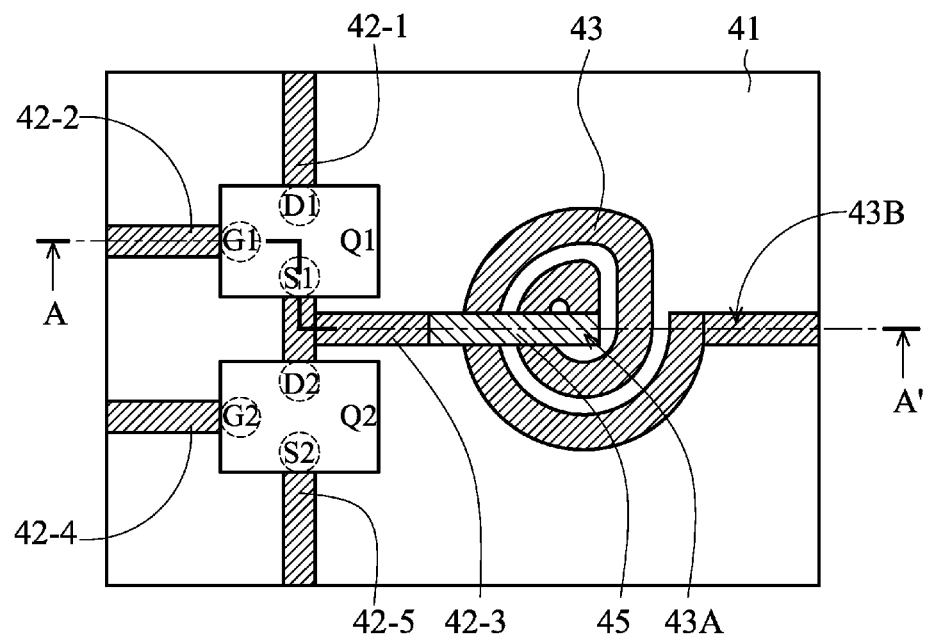
Figure 5B:
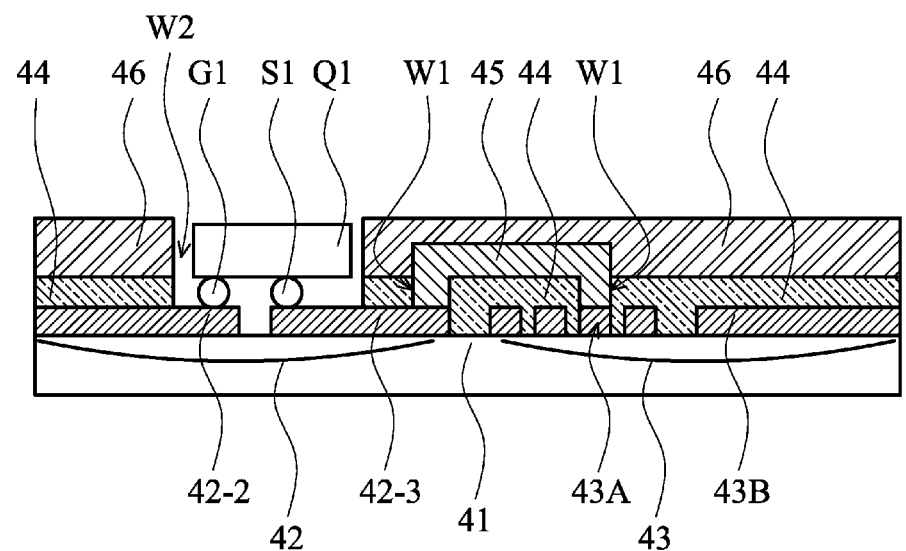

Refer to FIGS. 5A and 5B, wherein FIG. 5B is the side view along the cross section AA' of FIG. 5A. A second protection layer 46 is formed on the second connection layer 45 and the first protection layer 44, and a lithography process is performed to define a particular pattern. After, an etching process is performed to form a plurality of windows W2 on the second protection layer 46 and the first protection layer 44 (shown in FIG. 5B), exposing the first to fifth portions 42-1 to 42-5 of the first connection layer 42. After, transistors comprising a first transistor Q1 and a second transistor Q2 are electrically mounted on the substrate 41 via the first to fifth portions 42-1 to 42-5 of the first connection layer 42. In an embodiment of the invention, the first transistor Q1 and the second transistor Q2 are power NMOSFETs.

FIG. 5B shows the first transistor Q1 electrically connected to the first connection layer 42 through the window W2, wherein the gate G1 of the first transistor Q1 is electrically connected to the second portion 42-2 of the first connection layer 42, and the source S1 of the first transistor Q1 is electrically connected to the third portion 42-3 of the first connection layer 42, and the drain D1 of the first transistor Q1 is electrically connected to the first portion 42-1 of the first connection layer 42.

The second transistor Q2 is electrically connected to the first connection layer 42 through the window W2, wherein the drain D2 of the second transistor Q2 is electrically connected to the third portion 42-3 of the first connection layer 42, the gate G2 of the second transistor Q2 is electrically connected to the fourth portion 42-4 of the first connection layer 42, and the source S2 of the first transistor Q2 is electrically connected to the fifth portion 42-5 of the first connection layer 42.

In a preferred embodiment, the first transistor Q1 and the second transistor Q2 are discrete package units formed by chip-scale packaging, with through-substrate vias formed at the bottom side of the package units for external connections. Terminals of the first transistor Q1 and the second transistor Q2 electrically connect to the first to the fifth portions 42-1 to 42-5 of the first connection layer 42 through the windows W2 and through-substrate vias by solder bumps or copper pillars. In other embodiments, the second transistor Q2 can be replaced by a diode or a switching device.

Figure 6A:
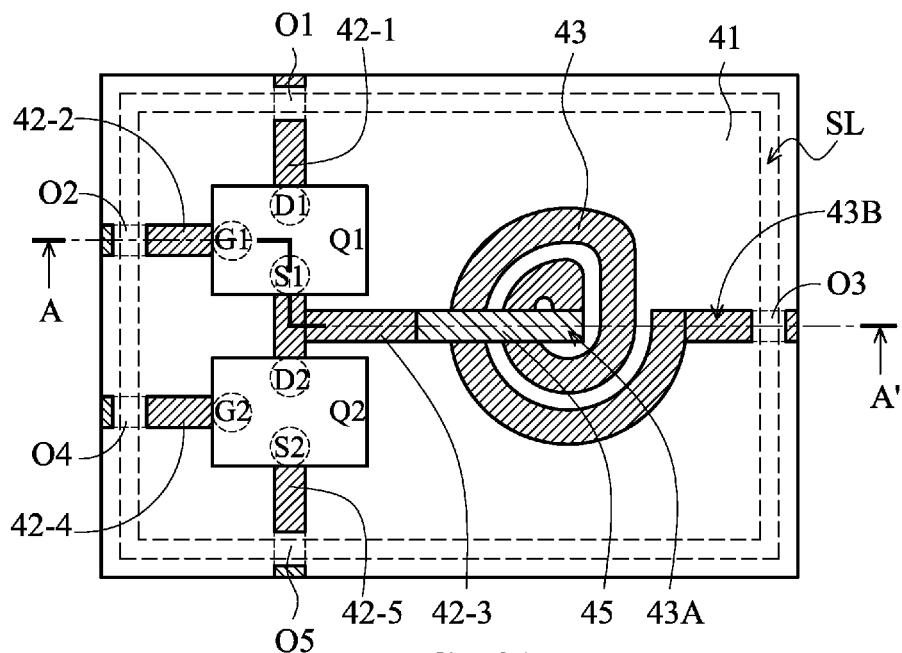
Figure 6B:
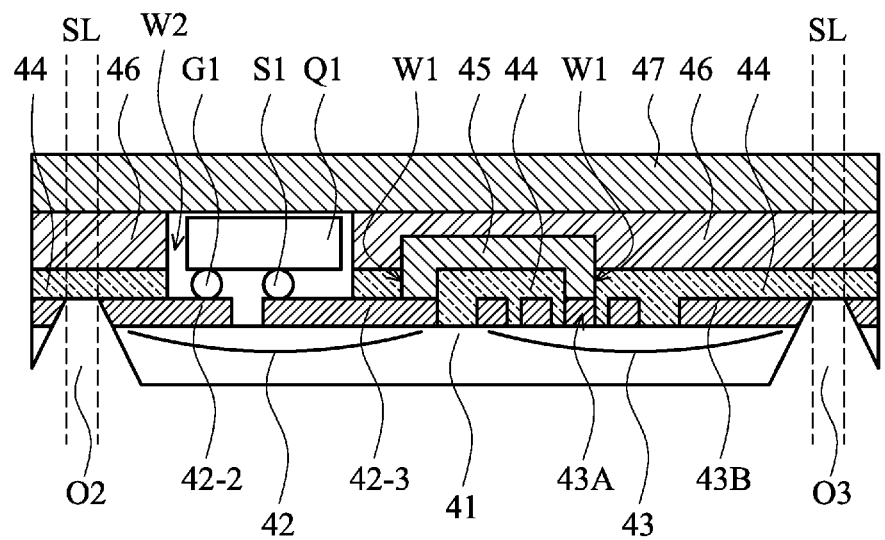

Refer to FIGS. 6A and 6B, wherein FIG. 6B is the side view along the cross section AA' of FIG. 6A. After mounting of the transistors Q1 and Q2, a carrier substrate 47 is attached on the first side of the substrate 41, which is on the same side where the transistors Q1 and Q2 are mounted (shown as FIG. 6B), and the carrier substrate 47 is temporarily fixed on the substrate 41 by gluing, in order to hold the substrate 41 in later processes. In some embodiments of the invention, the materials of the carrier substrate 47 can be glass or plastic, and the materials of glue can be polymers such as acrylic or epoxy resin. After, a plurality of openings comprising opening O1 to opening O5 are defined on the second side of the substrate 41 along a predetermined scribe lines SL. The opening O1 to the opening O5 can be formed using laser patterning or etching processes. Openings can be rectangular or circular shaped, and their locations are shown in FIG. 6A. For simplicity, the carrier substrate 47 is not shown in FIG. 6A.

As shown in FIG. 6B, openings O2 and O3 have leaning sidewalls, and the second portion 42-2 of the connection layer 42 and second terminal 43B of the conductive path layer 43 are exposed at the bottom of the openings O2 and O3. The openings O1, O4 and O5 have leaned sidewalls, and the first portion 42-1, the fourth portion 42-4 and the fifth portion 72-5 of the connection layer 42 are exposed at the bottom of the openings O1, O4 and O5.

Figure 7A:
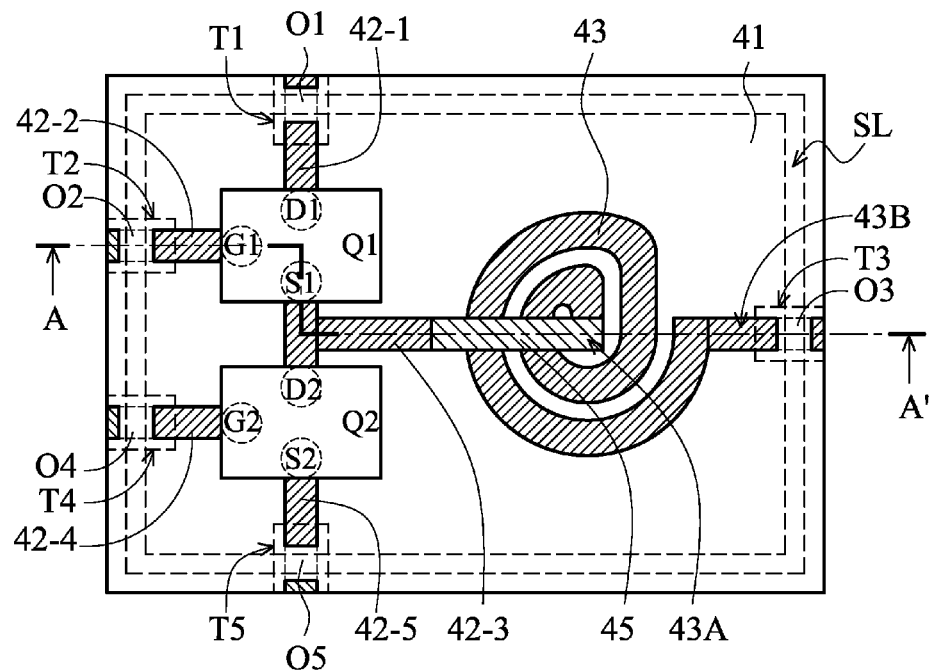
Figure 7B:
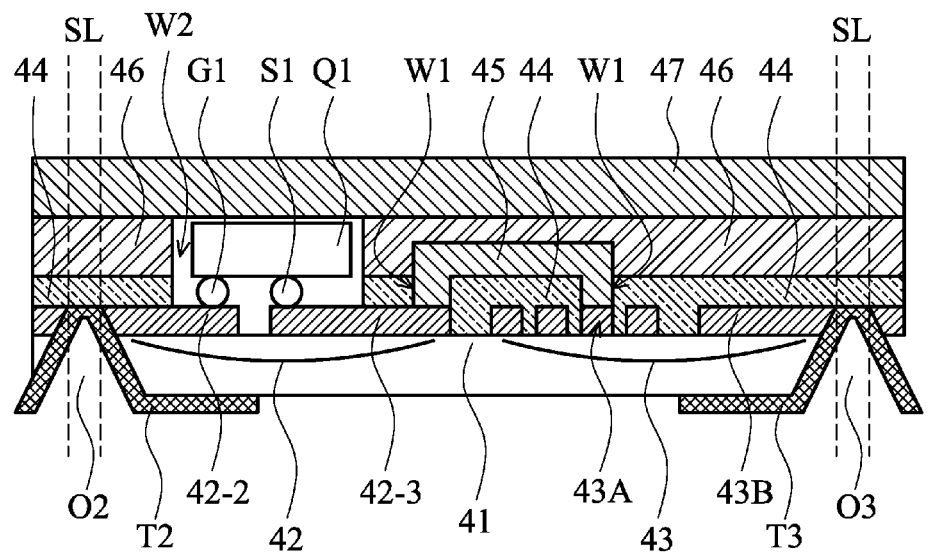

Refer to FIGS. 7A and 7B, wherein FIG. 7B is the side view along the AA' cross section of FIG. 7A. A conductive layer is formed on the second side of the substrate 41. After defining its pattern using the lithography process and etching step, a plurality of conductive contacts T1 to T5 are formed on the openings O1 to O5 on the second side of the substrate 41, respectively. In some embodiments of the invention, the conductive contacts T1 to T5 can be formed by sputtering, electroplating or PECVD. Materials of the conductive contacts T1 to T5 can be metal, such as Copper, Aluminum, Nickel etc., or combinations thereof.

As shown in FIG. 7B, each of the conductive contacts T2 and T3 has a terminal extending along the sidewalls of the openings O2 and O3 to the bottom of the openings O2 and O3 respectively and is electrically connected to the second portion 42-2 of the connection layer 42 and the second terminal 43B of the conductive path layer 43 respectively. Each of the conductive contacts T2 and T3 has another terminal extending on the second side of the substrate 41. Same as above, each of the conductive contacts T1, T4 and T5 has a terminal extending along the sidewalls of the openings O1, O4 and O5 to the bottom of the openings O1, O4 and O5 respectively and is electrically connected to the first portion 42-1 of the connection layer 42, the fourth portion 42-4 of the connection layer 42, and the fifth portion 42-5 of the connection layer 42, respectively. Each of the conductive contacts T1, T4 and T5 has another terminal extending on the second side of the substrate 41.

Figure 8A:
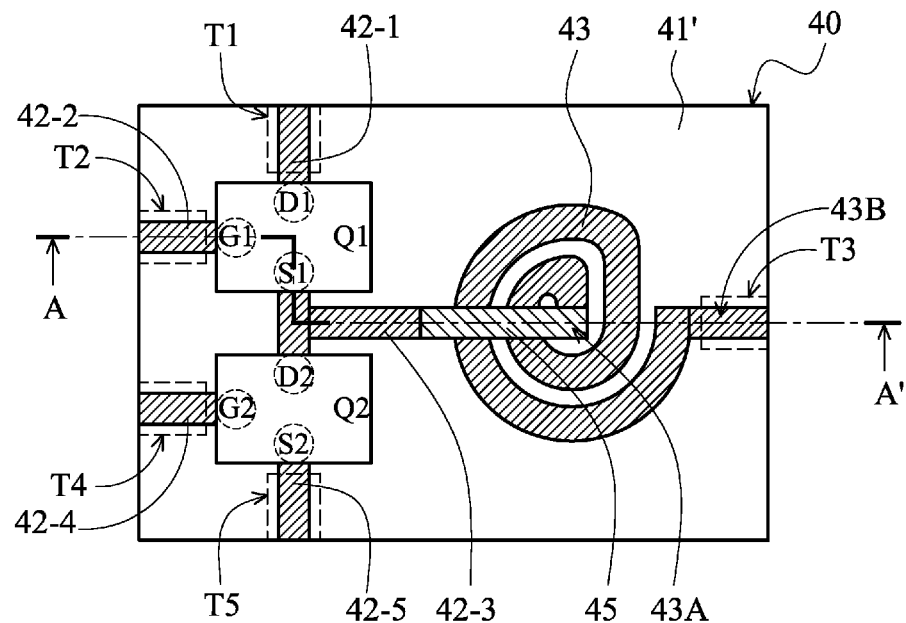
Figure 8B:
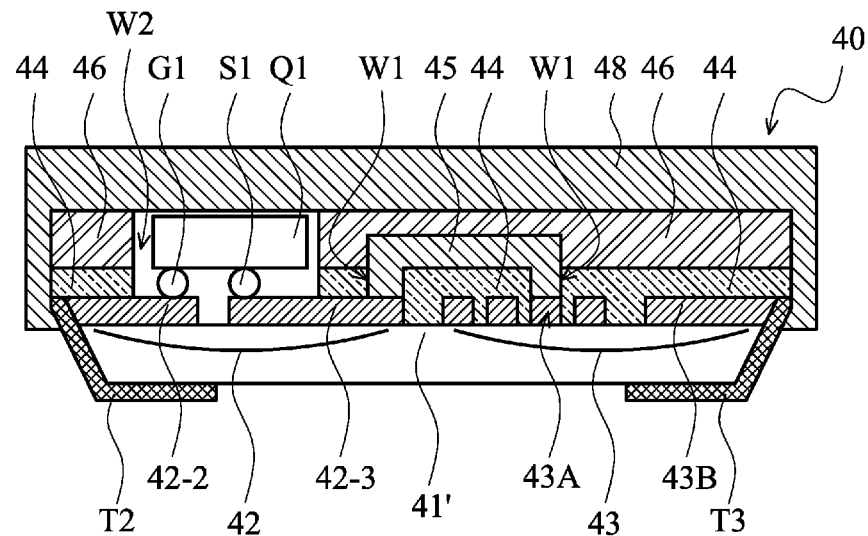

A solder mask (not shown) is formed covering the conductive contacts T1 to T5, preventing the conductive contacts T1 to T5 from being contaminated or damaged. The solder mask has a plurality of windows for forming solder bumps (not shown) as pins of the power module 40 for external connections. After, the substrate 41 is sliced along the scribe lines SL to separate it into at least a die 41', and the carrier substrate 47 is removed hereafter. Finally, an encapsulation 48 (as shown in FIG. 8B) is formed on the first side of the die 41' to cover the transistors Q1 and Q2. A discrete packaged power module 40 is shown in FIG. 8A. FIG. 8B is the side view along the AA' cross section of FIG. 8A.

Embodiments of power module process steps disclosed above are not intended to limit the scope of the invention. The process steps can be interchanged, altered or modified. For example, in another embodiment, after formation of the second protection layer 46, the carrier substrate 47 is fixed on the substrate 41, and then the conductive contacts T1 to T5 are formed. After, solder mask and solder bumps are formed, and then the substrate 41 is sliced into at least a die 41', and the carrier substrate 47 is removed from die 41'. Finally, the transistor devices Q1 and Q2 are mounted on the die 41', and the encapsulation 48 is formed.

In the embodiments above, the conductive contact T1 in the power module 40 is for receiving a DC power supply, the conductive contact T2 in the power module 40 is for receiving a first control signal controlling ON/OFF states of the first transistor Q1; the conductive contact T3 in the power module 40 is for electrically connecting the second terminal 43B of the conductive path layer 43 to a capacitor and a load; the conductive contact T4 in the power module 40 is for receiving a second control signal controlling ON/OFF states of the second transistor Q2 which is complementary to the first control signal, and the conductive contact T5 in the power module 40 is coupled to a reference voltage level.

In the invention, an inductor and a connection layer in the power module are directly formed by deposition or electroplating, which significantly lowers the cost and simplifies fabrication. Integrating chip-scale packaged transistors and inductor further improves footprint and saves the problem of matching transistors with inductors for designers. Furthermore, a wide variety of PWM controllers can be incorporated as long as their driving signal frequencies are on par with the switching speed of transistors in the power module to promote power management design efficiency.

What is claimed is:

1. A power module comprising:
a substrate;
an inductor formed on the substrate, wherein the inductor comprises a conductive path layer with a particular pattern;
a connection layer formed on the substrate, wherein the connection layer is electrically connected to a first terminal of the inductor; and
a first transistor, electrically mounted on the substrate through the connection layer,
wherein inductance value of the inductor depends on switching speed of the first transistor.

2. The power module as claimed in claim 1, wherein the substrate is a glass or an insulator.

3. The power module as claimed in claim 1, wherein the conductive path layer is formed by a deposition process or an electroplating process, and the particular pattern has a spiral shape, a transmission line shape, or a meander shape.

4. The power module as claimed in claim 1, wherein the first transistor further comprises a first, a second and a third terminal, and the connection layer further comprises:
a first portion, electrically connected to the first terminal of the first transistor to receive a DC power;
a second portion, electrically connected to the second terminal of the first transistor to receive a first control signal for controlling ON/OFF states of the first transistor; and
a third portion, electrically connected to the third terminal of the first transistor and the first terminal of the inductor.

5. The power module as claimed in claim 4 further comprising a second transistor, electrically mounted on the substrate through the connection layer;
the second transistor comprising a first, a second and a third terminal, wherein the first terminal of the second transistor is electrically connected to the first terminal of the inductor; and
the connection layer further comprising:
a fourth portion, electrically connected to the second terminal of the second transistor for receiving a second control signal, wherein the second control signal is complemetary to the first control signal; and
a fifth portion, electrically connected to the third terminal of the second transistor and electrically coupled to a reference voltage level.

6. The power module as claimed in claim 4 further comprising a plurality of conductive contacts electrically connected to the connection layer and a second terminal of the inductor.

7. The power module as claimed in claim 5 further comprising a plurality of conductive contacts electrically connected to the connection layer and a second terminal of the inductor.

8. The power module as claimed in claim 1, wherein the first transistor is a chip-scale packaged discrete power MOSFET.

9. The power module as claimed in claim 5, wherein the first and the second transistors are chip-scale packaged discrete power MOSFETs.

10. The power module as claimed in claim 1, wherein the inductor is directly formed on the substrate.

11. The power module as claimed in claim 1, wherein the first transistor is a separate component mounted on the substrate via at least a connecting layer.

12. A method of packaging a power module, comprising:
providing a substrate;
forming a connection layer and a conductive path layer on a first side of the substrate, wherein the conductive path layer comprises a particular pattern to work as an inductor, and the connection layer is electrically connected to a first terminal of the conductive path layer; and mounting at least one transistor electrically through the conductive path layer on the substrate, wherein inductance value of the inductor depends on switching speed of the at least one transistor.

13. The method as claimed in claim 12, wherein the substrate is a glass or an insulator.

14. The method as claimed in claim 12, wherein the connection layer is formed by a deposition process or an electroplating process, and the particular pattern has a spiral shape, a transmission line shape, or a meander shape.

15. The method as claimed in claim 12, wherein the at least one transistor is a chip-scale packaged discrete power MOSFET.

16. The method as claimed in claim 12, wherein the at least one transistor comprises a first transistor and a second transistor, wherein the first transistor comprises a first, a second and a third terminal, and the second transistor comprises a first, a second and a third terminal, wherein the connection layer further comprises:
a first portion, electrically connected to the first terminal of the first transistor;
a second portion, electrically connected to the second terminal of the first transistor;
a third portion, electrically connected to the third terminal of the first transistor, the first terminal of the second transistor, and the first terminal of the conductive path layer;
a fourth portion, electrically connected to the second terminal of the second transistor; and
a fifth portion, electrically connected to the third terminal of the second transistor.

17. The method as claimed in claim 16 further comprising:
temporarily fixing a carrier substrate on the first side of the substrate;
forming a plurality of openings on the second side of the substrate, exposing a portion of the connection layer and a second terminal of the conductive path layer through the openings, wherein the second side is on the opposite side of the first side; and
forming a plurality of conductive contacts on the second side of the substrate, wherein the conductive contacts comprise:
a first conductive contact, electrically connected to the first portion of the connection layer through a first opening;
a second conductive contact, electrically connected to the second portion of the connection layer through a second opening;
a third conductive contact, electrically connected to the third portion of the conductive path layer through a third opening;
a fourth conductive contact, electrically connected to the fourth portion of the connection layer through a fourth opening; and
a fifth conductive contact, electrically connected to the fifth portion of the connection layer through a fifth opening.

18. The method as claimed in claim 17 further comprising:
removing the carrier substrate after the formation of the conductive contacts; and
covering the at least one transistor and the conductive path layer on the first side of the substrate with a molding compound.

19. The method as claimed in claim 12 further comprising:
temporarily fixing a carrier substrate on the first side of the substrate;
forming a plurality of openings on the second side of the substrate to expose a portion of the connection layer and a second terminal of the conductive path layer through the openings, wherein the second side is on the opposite side of the first side; and
forming a plurality of conductive contacts on the second side of the substrate, wherein the conductive contacts electrically connect to portions of the connection layer and the second terminal of the conductive path layer through the openings.

20. The method as claimed in claim 19 further comprising:
removing the carrier substrate after the formation of the conductive contacts; and
covering the at least one transistor and the conductive path layer on the first side of the substrate with a molding compound.

* * * * *